(12) United States Patent
Yu et al.

(10) Patent No.: US 8,409,894 B2
(45) Date of Patent: Apr. 2, 2013

(54) SOLID STATE LIGHT EMITTING SEMICONDUCTOR STRUCTURE AND EPITAXY GROWTH METHOD THEREOF

(75) Inventors: Chang-Chin Yu, Zhubei (TW); Mong-Ea Lin, Zhubei (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/443,446

(22) Filed: Apr. 10, 2012

(65) Prior Publication Data
US 2013/0048941 A1 Feb. 28, 2013

(30) Foreign Application Priority Data
Aug. 30, 2011 (TW) .............................. 100131138 A

(51) Int. Cl.
*H01L 21/00* (2006.01)

(52) U.S. Cl. .................. 438/41; 438/481; 257/E21.487

(58) Field of Classification Search ........... 257/E21.483, 257/E21.487, E21.488, E21.532, E21.536
See application file for complete search history.

(56) References Cited

U.S. PATENT DOCUMENTS
2012/0001197 A1* 1/2012 Liaw et al. ...................... 257/77
* cited by examiner

*Primary Examiner* — Cheung Lee
(74) *Attorney, Agent, or Firm* — McClure, Qualey & Rodack, LLP

(57) ABSTRACT

A solid state light emitting semiconductor structure and an epitaxy growth method thereof are provided. The method includes the following steps: A substrate is provided. A plurality of protrusions separated from each other are formed on the substrate. A buffer layer is formed on the protrusions, and fills or partially fills the gaps between the protrusions. A semiconductor epitaxy stacking layer is formed on the buffer layer, wherein the semiconductor epitaxy stacking layer is constituted by a first type semiconductor layer, an active layer and a second type semiconductor layer in sequence.

20 Claims, 2 Drawing Sheets

SOLID STATE LIGHT EMITTING SEMICONDUCTOR STRUCTURE AND EPITAXY GROWTH METHOD THEREOF

BACKGROUND OF THE INVENTION

1. Field of the Invention

The invention relates in general to a light emitting structure, and more particularly to a solid state light emitting semiconductor structure and an epitaxy growth method thereof.

2. Description of the Related Art

The light-emitting diode (LED) emits a light by converting electric energy into photo energy. The LED is mainly composed of semiconductors. Of the semiconductors, those having a larger ratio of holes carrying positive electricity are referred as P type semiconductors, and those having a larger ratio of electrons carrying negative electricity are referred as N type semiconductors. The junction connecting a P type semiconductor and an N type semiconductor forms a PN junction. When a voltage is applied to the positive polarity and negative polarity of an LED chip, the electrons and the holes will be combined and emit energy in the form of a light.

The development of blue light-emitting diodes formed by gallium nitride (GaN) is slow due to the restrictions of the materials. In the example of using sapphire as an epitaxy carrier, a buffer layer is formed on the substrate first, and then GaN is formed on the buffer layer. By doing so, the obtained GaN crystals have good quality. However, the sapphire substrate has poor performance in thermo-conductivity, an epitaxial structure must be transferred to a substrate with high thermo-conductivity to increase the dissipation efficiency of the light emitting diodes. Thus, the conventional manufacturing method, which incurs high manufacturing cost and increases process difficulties, is by no means a good choice. On the other hand, when directly forming GaN crystals on low-cost silicon substrate, multi-crystalline GaN will be formed, and crack may easily during the crystallization under high temperatures. Consequently, high quality GaN crystals without cracks can hardly obtained, and the manufacturing process needs to be improved further.

SUMMARY OF THE INVENTION

The invention is directed to a solid state light emitting semiconductor structure and an epitaxy growth method thereof for manufacturing an epitaxy layer with high quality and high illumination efficiency.

According to one embodiment, an epitaxy growth method of a solid state light emitting semiconductor structure is provided. The method includes the following steps: A substrate is provided. A plurality of protrusions separated from each other is formed on the substrate. A buffer layer is formed on the protrusions, and fills or partially fills the gaps between the protrusions. A semiconductor epitaxy stacking layer is formed on the buffer layer, wherein the semiconductor epitaxy stacking layer is constituted by a first type semiconductor layer, an active layer and a second type semiconductor layer in sequence.

According to another embodiment, a solid state light emitting semiconductor structure is provided. The solid state light emitting semiconductor structure includes a substrate, a plurality of protrusions, a buffer layer and a semiconductor epitaxy stacking layer. The protrusions are separated from each other and formed on the substrate. The buffer layer is formed on protrusions and fills or partially fills the gaps between the protrusions. The semiconductor epitaxy stacking layer is formed on the buffer layer, wherein semiconductor epitaxy stacking layer is constituted by a first type semiconductor layer, an active layer and a second type semiconductor layer in sequence.

The above and other aspects of the invention will become better understood with regard to the following detailed description of the preferred but non-limiting embodiment(s). The following description is made with reference to the accompanying drawings.

DETAILED DESCRIPTION OF THE INVENTION

A solid state light emitting semiconductor structure and an epitaxy growth method thereof are disclosed in the present embodiment of the disclosure. A buffer layer is formed on the protrusions of a substrate by a vapor deposition process. The buffer layer is formed laterally and fills the gaps between the protrusions on the substrate to reduce the stress arising due to the difference in lattice constants between the semiconductor substrate and the semiconductor epitaxy stacking layer, and avoid the occurrence of longitudinal penetrating crack lest the quality of the epitaxy layer might deteriorate. Therefore, after a long duration of crystal growth, the quality of the semiconductor epitaxy stacking layer is still conformed to the requirements.

The buffer layer may be selected from a group constituted by composition such as aluminum nitride (AlN), aluminum gallium nitride (AlGaN) or silicon carbide. Besides, the semiconductor epitaxy stacking layer is formed by a nitride contained the elements of group IIIA of the periodic table. Elements of group IRA include boron, aluminum, gallium, indium, thallium or a combination thereof. Also, impurities such as magnesium or calcium may be added to the N type semiconductor layer, and impurities such as silicon, sulfur, selenium, antimony, or germanium may be added to the P type semiconductor layer.

A number of embodiments are disclosed below for elaborating the invention. However, the embodiments of the invention are for detailed descriptions only, not for limiting the scope of protection of the invention.

Figure 1A:
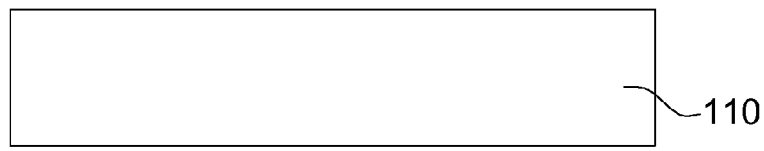
FIGS. 1A~1D are procedures of an epitaxy growth method of a solid state light emitting semiconductor structure according to an embodiment of the disclosure.
Figure 1B:
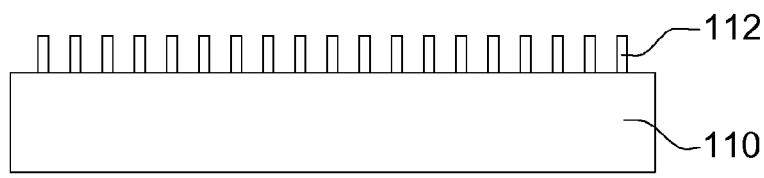
Figure 1C:
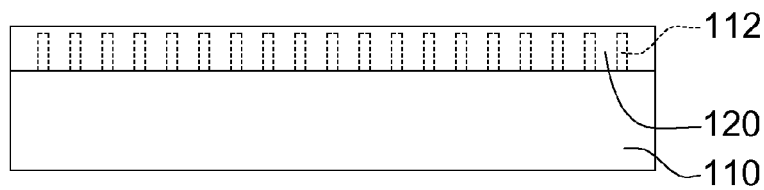

FIGS. 1A~1D are procedures of an epitaxy growth method of a solid state light emitting semiconductor structure according to an embodiment of the disclosure. FIG. 2 is a schematic diagram of a solid state light emitting semiconductor structure according to an embodiment of the disclosure. The solid state light emitting semiconductor structure 100 includes a substrate 110, a plurality of protrusions 112, a buffer layer 120 and a semiconductor epitaxy stacking layer 130. Details of the epitaxy growth method of the solid state light emitting semiconductor structure 100 are disclosed below.

Referring to FIGS. 1A~1D. First, a substrate 110 is provided. Next, a plurality of protrusions separated from each other 112 is formed on the substrate 110. Then, a buffer layer 120 is formed on the protrusions 112, and fills the gaps between the protrusions 112. Then, a semiconductor epitaxy stacking layer 130 is formed on the buffer layer 120, wherein the semiconductor epitaxy stacking layer 130 is constituted by a first type semiconductor layer 132, an active layer 134 and a second type semiconductor layer 136 in sequence.

In an embodiment, the materials of the protrusions 112 and the substrate 110 include silicon. As shown in FIG. 1B, the protrusions 112 may be realized by silicon crystal protrusions 112 formed by applying lithography and etching process on the substrate 110. The substrate 110 may be etched by way of wet etching or dry etching. The protrusions 112 periodically form bumpy structures on the surface of the substrate 110 at suitable intervals. As shown in FIG. 1C, the buffer layer 120 uniformly fill the gaps between the protrusions 112. The protrusions 112 can be nano-pillar structures or micrometer-pillar structures, and the height of the protrusions 112 ranges between 10~10,000 nano-meters (10 micro-meters) and preferably between 100~200 nano-meters. The distance between the apexes of two neighboring protrusions 112 ranges between 10~1,000 nano-meters and preferably between 50~100 nano-meters. The geometric shape of the protrusions 112 may be triangle, rectangles, diamonds or polygons, and the disclosure does not have further restrictions regarding the shape. Through the adjustment in the sizes, gaps, and crystallization growth conditions of the protrusions 112, the film thickness of the buffer layer 120 will be reduced.

FIG. 2 shows a solid state light emitting semiconductor structure 100' according to another embodiment. The buffer layer 120 may only partially fill the gaps between the protrusions 112. Let the gaps 114 of FIG. 2 be taken for example, the lower half of the gaps is not deposited by the buffer layer 120, and the upper half of the gaps is deposited by the buffer layer 120.

The buffer layer 120 may be laterally formed from the apex and the lateral sides of the protrusions 112 until the structures are interconnected to form a continuous plane. The stress arising due to the difference in lattice constants between the semiconductor epitaxy stacking layer 130 and the substrate 110 disposed underneath is reduced. Thus, the occurrence of longitudinal penetrating crack is avoided, and the crystallization quality of the semiconductor epitaxy stacking layer 130 is improved.

The buffer layer 120 may be formed by way of chemical vapor deposition (CVD) process or physical vapor deposition (PVD) process. Examples of chemical vapor deposition process include hot filament chemical vapor deposition process and microwave plasma enhanced chemical vapor deposition process. Examples of physical vapor deposition process include ion beam sputtering process and evaporation process. Also, the semiconductor epitaxy stacking layer 130 may be formed by way of metal-organic chemical vapor deposition (MOCVD) process, molecular beam epitaxy (MBE) process, liquid phase epitaxy method (LPE) process or vapor phase epitaxy (VPE) process.

Figure 1D:
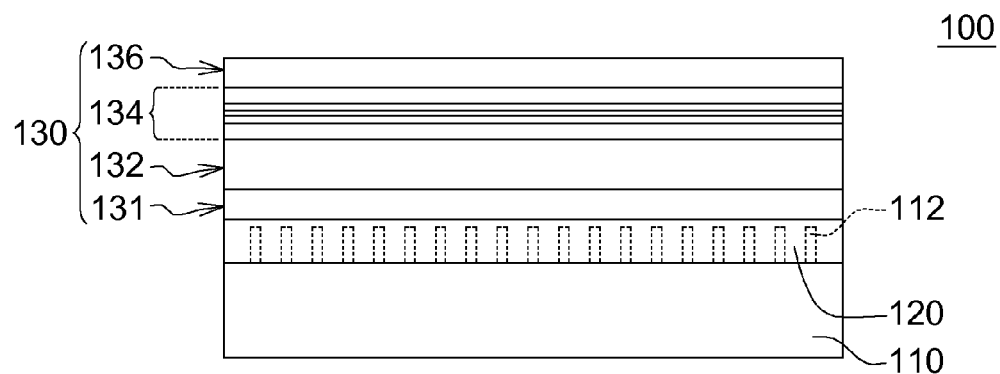
Figure 2:
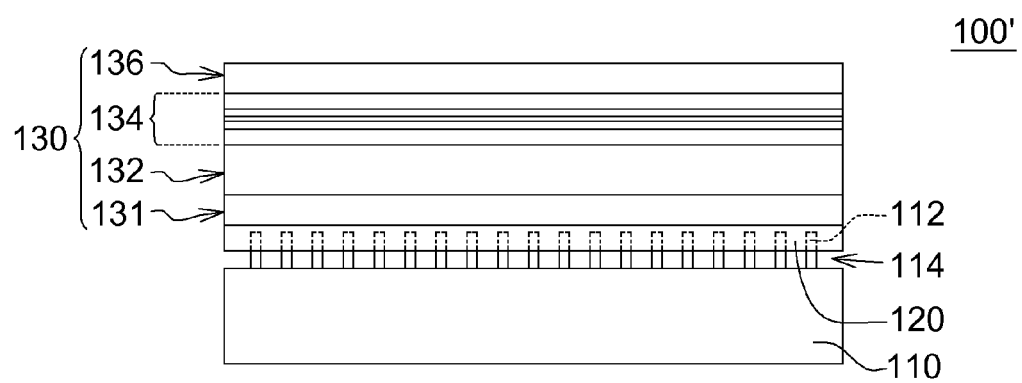
FIG. 2 is a schematic diagram of a solid state light emitting semiconductor structure according to an embodiment of the disclosure.

As shown in FIG. 1D, the active layer 134 of the semiconductor epitaxy stacking layer 130 includes multiple quantum well layers. The first type semiconductor layer 132 can be realized by a nitride semiconductor layer doped with N type impurities, and the second type semiconductor layer 136 may be realized by a nitride semiconductor layer doped with P type impurities. The first type semiconductor layer 132 and the second type semiconductor layer 136 may be realized by an N type semiconductor layer and a P type semiconductor layer which have different electric properties, and may be formed by a nitride contained the elements of group IIIA of the periodic table such as GaN, AlGaN, InGaN or nitride of aluminum indium gallium.

As shown in FIG. 1D, a nitride epitaxy layer 131 not doped with impurities may be selectively formed between the buffer layer 120 and the first type semiconductor layer 132, and the nitride epitaxy layer 131 not doped with impurities is formed by a nitride contained the elements of group IRA of the periodic table such as AlN, GaN or InGaN.

Subsequent manufacturing process is not illustrated in the present embodiment of the disclosure. However, the semiconductor epitaxy stacking layer 130 may be patterned according to actual needs to expose a part of the first type semiconductor layer 132 to form a light emitting diode with a mesa structure.

A solid state light emitting semiconductor structure and an epitaxy growth method thereof are disclosed in the present embodiment of the disclosure. A buffer layer is formed on the protrusions of a substrate by a vapor deposition process. The buffer layer is formed laterally and fills the gaps between the substrate protrusions to reduce the stress arising due to the difference in lattice constants between the semiconductor substrate and the semiconductor epitaxy stacking layer. Besides, the arrangement of forming the buffer layer on the protrusions of the substrate overcomes the difficulties encountered in forming high quality semiconductor epitaxy stacking layer on the silicon substrate, and further improves the quality of the products. Moreover, the single-crystal silicon substrate used as an epitaxy carrier has better performance in thermo-conductivity and there is no need to remove the substrate, not only simplifying the procedures and costs of the manufacturing process but further increase the illumination efficiency of the light emitting diode.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An epitaxy growth method of a solid state light emitting semiconductor structure, wherein the method comprises:
   providing a substrate;
   forming a plurality of protrusions separated from each other on the substrate;
   forming a buffer layer on the protrusions, wherein the buffer layer fills or partially fills the gaps between the protrusions; and
   forming a semiconductor epitaxy stacking layer on the buffer layer, wherein the semiconductor epitaxy stacking layer is constituted by a first type semiconductor layer, an active layer and a second type semiconductor layer in sequence.

2. The method according to claim 1, wherein the method for forming the protrusion comprises lithography and etching.

3. The method according to claim 1, wherein the buffer layer is formed by chemical vapor deposition process.

4. The method according to claim 1, wherein the protrusions are nano-pillar structures, and the height of each nano-pillar structure ranges between 10~10,000 nano-meters.

5. The method according to claim 1, wherein the distance between apexes of two neighboring protrusion structures ranges between 10~1,000 nano-meters.

6. The method according to claim 1, wherein the buffer layer is selected by a group composed of aluminum nitride (AlN) and aluminum gallium nitride (AlGaN).

7. The method according to claim 1, wherein the semiconductor epitaxy layer is formed by a nitride contained the elements of group IIIA of the periodic table.

8. The method according to claim 1, wherein a material of the protrusions comprises silicon, and a material of the substrate comprises silicon.

9. The method according to claim 1, wherein the first type semiconductor layer is an N type semiconductor layer, and the second type semiconductor layer is a P type semiconductor layer.

10. The method according to claim 1, wherein the active layer comprises multiple quantum well layers.

11. The method according to claim 1, further comprises forming a nitride epitaxy layer not doped with impurities between the buffer layer and the first type semiconductor layer, and the nitride epitaxy layer not doped with impurities is formed by a nitride contained the elements of group IIIA of the periodic table.

12. A solid state light emitting semiconductor structure, comprising:
    a substrate;
    a plurality of protrusions separated from each other and formed on the substrate;
    a buffer layer formed on the protrusions, wherein the buffer layer fills or partially fills the gaps between the protrusions; and
    a semiconductor epitaxy stacking layer formed on the buffer layer, wherein the semiconductor epitaxy stacking layer is constituted by a first type semiconductor layer, an active layer and a second type semiconductor layer in sequence.

13. The solid state light emitting semiconductor structure according to claim 12, wherein the protrusions are nano-pillar structures, and the height of each nano-pillar structure ranges between 10~10,000 nano-meters.

14. The solid state light emitting semiconductor structure according to claim 12, wherein the distance between apexes of two neighboring protrusion structures ranges between 10~1,000 nano-meters.

15. The solid state light emitting semiconductor structure according to claim 12, wherein the buffer layer is selected by a group composed of aluminum nitride (AlN) and aluminum gallium nitride (AlGaN).

16. The solid state light emitting semiconductor structure according to claim 12, wherein the semiconductor epitaxy stacking layer is formed by a nitride contained the elements of group IIIA of the periodic table.

17. The solid state light emitting semiconductor structure according to claim 12, wherein a material of protrusions and the base material comprises silicon.

18. The solid state light emitting semiconductor structure according to claim 12, wherein the first type semiconductor layer is an N type semiconductor layer, and the second type semiconductor layer is a P type semiconductor layer.

19. The solid state light emitting semiconductor structure according to claim 12, wherein the active layer comprises multiple quantum well layers.

20. The solid state light emitting semiconductor structure according to claim 12, further comprising a nitride epitaxy layer not doped with impurities between the buffer layer and the first type semiconductor layer, and the nitride epitaxy layer not doped with impurities is formed by a nitride contained the elements of group IIIA of the periodic table.

* * * * *